United States Patent
Huang et al.

(10) Patent No.: US 9,705,455 B2
(45) Date of Patent: Jul. 11, 2017

(54) RANDOM CHOPPER CONTROL CIRCUIT

(71) Applicant: Raydium Semiconductor Corporation, Hsinchu (TW)

(72) Inventors: Chih-Chuan Huang, Kaohsiung (TW); Wen-Tsung Lin, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 15/041,429

(22) Filed: Feb. 11, 2016

(65) Prior Publication Data

US 2016/0261244 A1    Sep. 8, 2016

(30) Foreign Application Priority Data

Mar. 3, 2015 (TW) ............................. 104106695 A

(51) Int. Cl.
| | |
|---|---|
| *H03F 3/387* | (2006.01) |
| *H03K 3/84* | (2006.01) |
| *H03F 3/45* | (2006.01) |

(52) U.S. Cl.
CPC ......... *H03F 3/387* (2013.01); *H03F 3/45475* (2013.01); *H03F 3/45744* (2013.01); *H03K 3/84* (2013.01); *H03F 2200/129* (2013.01); *H03F 2203/45138* (2013.01); *H03F 2203/45212* (2013.01)

(58) Field of Classification Search
CPC .................................................... H03F 3/45892
USPC ....................................... 330/9; 327/124, 307
See application file for complete search history.

(56) References Cited

U.S. PATENT DOCUMENTS

| | | | |
|---|---|---|---|
| 5,115,202 A * | 5/1992 | Brown .................... | H03F 3/387 327/124 |
| 7,602,237 B2 * | 10/2009 | Shimizu .................. | H03F 1/305 330/51 |
| 8,098,087 B1 * | 1/2012 | Lam .................. | H04L 25/03878 327/307 |
| 8,508,290 B2 * | 8/2013 | Elsayed ............. | G01C 19/5776 327/552 |
| 2009/0309653 A1 * | 12/2009 | Luff ........................ | H03F 3/393 330/9 |

\* cited by examiner

*Primary Examiner* — Henry Choe

(57) ABSTRACT

A random chopper control circuit is disclosed. The random chopper control circuit is coupled to an operational amplifier. The random chopper control circuit includes a random generator. The random generator is configured to generate a random chopper control signal and output the random chopper control signal to the operational amplifier to control an operation of the operational amplifier.

7 Claims, 5 Drawing Sheets

FIG. 2 (PRIOR ART)

|    | X4 | X3 | X2 | X1 |
|----|----|----|----|----|
| 0  | 1  | 1  | 1  | 1  |
| 1  | 1  | 1  | 1  | 0  |
| 2  | 1  | 1  | 0  | 0  |
| 3  | 1  | 0  | 0  | 0  |
| 4  | 0  | 0  | 0  | 1  |
| 5  | 0  | 0  | 1  | 0  |
| 6  | 0  | 1  | 0  | 0  |
| 7  | 1  | 0  | 0  | 1  |
| 8  | 0  | 0  | 1  | 1  |
| 9  | 0  | 1  | 1  | 0  |
| 10 | 1  | 1  | 0  | 1  |
| 11 | 1  | 0  | 1  | 0  |
| 12 | 0  | 1  | 0  | 1  |
| 13 | 1  | 0  | 1  | 1  |
| 14 | 0  | 1  | 1  | 1  |
| 15 | 1  | 1  | 1  | 1  |

|  | F1 | | | | | | F2 | | | | | | F3 | | | | | | F4 | | | | | |
|---|---|---|---|---|---|---|---|---|---|---|---|---|---|---|---|---|---|---|---|---|---|---|---|---|
|  | R | G | B | R | G | B | R | G | B | R | G | B | R | G | B | R | G | B | R | G | B | R | G | B |
| L1  | + |  | + | + |  | + | − |  | − | − |  | − | + |  | + | + |  | + | − |  | − | − |  | − |
| L2  | + |  | + | + |  | + | − |  | − | − |  | − | + |  | + | + |  | + | − |  | − | − |  | − |
| L3  | + |  | + | + |  | + | − |  | − | − |  | − | + |  | + | + |  | + | − |  | − | − |  | − |
| L4  | + |  | + | + |  | + | − |  | − | − |  | − | + |  | + | + |  | + | − |  | − | − |  | − |
| L5  | − |  | − | − |  | − | + |  | + | + |  | + | − |  | − | − |  | − | + |  | + | + |  | + |
| L6  | − |  | − | − |  | − | + |  | + | + |  | + | − |  | − | − |  | − | + |  | + | + |  | + |
| L7  | − |  | − | − |  | − | + |  | + | + |  | + | − |  | − | − |  | − | + |  | + | + |  | + |
| L8  | + |  | + | + |  | + | − |  | − | − |  | − | + |  | + | + |  | + | − |  | − | − |  | − |
| L9  | − |  | − | − |  | − | + |  | + | + |  | + | − |  | − | − |  | − | + |  | + | + |  | + |
| L10 | − |  | − | − |  | − | + |  | + | + |  | + | − |  | − | − |  | − | + |  | + | + |  | + |
| L11 | + |  | + | + |  | + | − |  | − | − |  | − | + |  | + | + |  | + | − |  | − | − |  | − |
| L12 | + |  | + | + |  | + | − |  | − | − |  | − | + |  | + | + |  | + | − |  | − | − |  | − |
| L13 | − |  | − | − |  | − | + |  | + | + |  | + | − |  | − | − |  | − | + |  | + | + |  | + |
| L14 | + |  | + | + |  | + | − |  | − | − |  | − | + |  | + | + |  | + | − |  | − | − |  | − |
| L15 | − |  | − | − |  | − | + |  | + | + |  | + | − |  | − | − |  | − | + |  | + | + |  | + |
| L16 | + |  | + | + |  | + | − |  | − | − |  | − | + |  | + | + |  | + | − |  | − | − |  | − |

RANDOM CHOPPER CONTROL CIRCUIT

BACKGROUND OF THE INVENTION

Field of the Invention

This invention relates to offset voltage elimination, especially to a random chopper control circuit.

Description of the Related Art

In general, in a LCD panel driving system, gate drivers and source drivers are necessary to control pixels of the LCD panel. The gate drivers are used to control gates of the pixels of the LCD panel switched on or off; the source drivers are used to provide driving voltages to corresponding pixels of the LCD panel. For a LCD apparatus, a lot of source drivers are necessary to provide driving voltages to all pixels of the LCD panel, and each source driver usually includes hundreds of buffers to provide driving voltages to different pixels respectively.

Because there will be differences in the manufacturing process, each buffer will have its own offset voltage. A chopper stabilization method and an auto-zeroing method are usually used to eliminate the offset voltage.

As to the chopper stabilization method, the offset voltage can be eliminated in space and in time. For the elimination in space, the offset voltage of each pixel can be eliminated by adjacent pixels. For the elimination in time, each pixel has an offset voltage when it displays a frame and the offset voltage can be eliminated by itself when it displays another frame next to the frame.

In the conventional chopper algorithm, a chopper control signal is designed to perform changes line by line or frame by frame in a regular arranging order. Please refer to FIG. 1, a frame control signal YDIO is used to indicate the start of each frame; a line control signal STB is used to indicate the start of each line; a first chopper control signal CH1~a third chopper control signal CH3 are used to control the switching of the exchange unit of the amplifier in different arranging orders respectively to realize offset voltage elimination.

For example, as to the first chopper control signal CH1, as shown in FIG. 1, the first chopper control signal CH1 has a regular arranging order (1F1L) of +, −, +, −, +, − for the N-th frame and −, +, −, +, −, + for the (N+1)-th frame.

As shown in FIG. 2, the first chopper control signal CH1 performs voltage offset on the green pixel G of the first frame F1 line by line from the first line L1 to the sixteenth line L16 through its regular arranging order (1F1L) of +, −, +, −, +, −, +, −, +, −, +, −, +, −, +, −, wherein + represents positive voltage offset and − represents negative voltage offset. Then, the first chopper control signal CH1 performs voltage offset on the green pixel G of the second frame F2 line by line from the first line L1 to the sixteenth line L16 through its regular arranging order (1F1L) of −, +, −, +, −, +, −, +, −, +, −, +, −, +, −, +. As to the third frame F3 and the fourth frame F4, they can be referred to the above-mentioned first frame F1 and second frame F2.

However, in some specific display applications, since the offset voltage elimination in time is limited by the low frame rate, the LCD panel will appear flicker phenomenon. In addition, in some specific panel structure, some "Killer Patterns" fail to eliminate the offset voltage in space. The above-mentioned conditions will cause the failure of the chopper stabilization method and the offset voltage elimination cannot be eliminated successfully.

Therefore, the invention provides a random chopper control circuit to solve the above-mentioned problems.

SUMMARY OF THE INVENTION

A preferred embodiment of the invention is random chopper control circuit. In this embodiment, the random chopper control circuit is coupled to an operational amplifier. The random chopper control circuit includes a random generator. The random generator is configured to generate a random chopper control signal and output the random chopper control signal to the operational amplifier to control an operation of the operational amplifier.

In an embodiment, the random generator generates the random chopper control signal having a random sequence according to a random algorithm.

In an embodiment, the operational amplifier includes a first exchanging unit, a first stage amplifying unit, a second exchanging unit and a second stage amplifying unit. The first exchanging unit is coupled to the random generator. The first stage amplifying unit is coupled to the first exchanging unit and the random generator. The second exchanging unit is coupled to the first stage amplifying unit. The second stage amplifying unit is coupled to the second exchanging unit, the first exchanging unit and the random generator.

In an embodiment, the first exchanging unit, the first stage amplifying unit and the second stage amplifying unit receive the random chopper control signal outputted by the random generator respectively.

In an embodiment, when the first exchanging unit receives an input signal and receives a first output signal from an output terminal of the second stage amplifying unit, the first exchanging unit selectively exchanges the input signal and the first output signal according to the random chopper control signal and then outputs the first output signal and the input signal to a positive input terminal and a negative input terminal of the first stage amplifying unit respectively.

In an embodiment, when the first stage amplifying unit receives the first output signal and the input signal, the first stage amplifying unit amplifies the first output signal and the input signal according to the random chopper control signal and outputs a first amplified signal and a second amplified signal to the second exchanging unit respectively.

In an embodiment, the second exchanging unit selectively exchanges the first amplified signal and the second amplified signal and then outputs the second amplified signal and the first amplified signal to a positive input terminal and a negative input terminal of the second stage amplifying unit respectively.

In an embodiment, when the second stage amplifying unit receives the second amplified signal and the first amplified signal, the second stage amplifying unit amplifies the second amplified signal and the first amplified signal according to the random chopper control signal and then outputs a second output signal.

Compared to the prior art, in the random chopper control circuit of the invention, the chopper control signal uses random arranging order to make changes line by line or frame by frame; therefore, it is hard to detect these changes visually and the drawback that the changes are easily detected visually due to the regular arranging order of the offset voltage in the pixels can be effectively avoided. And, the random chopper control circuit of the invention can also effectively eliminate the offset voltages in different kinds of display panel.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 2:
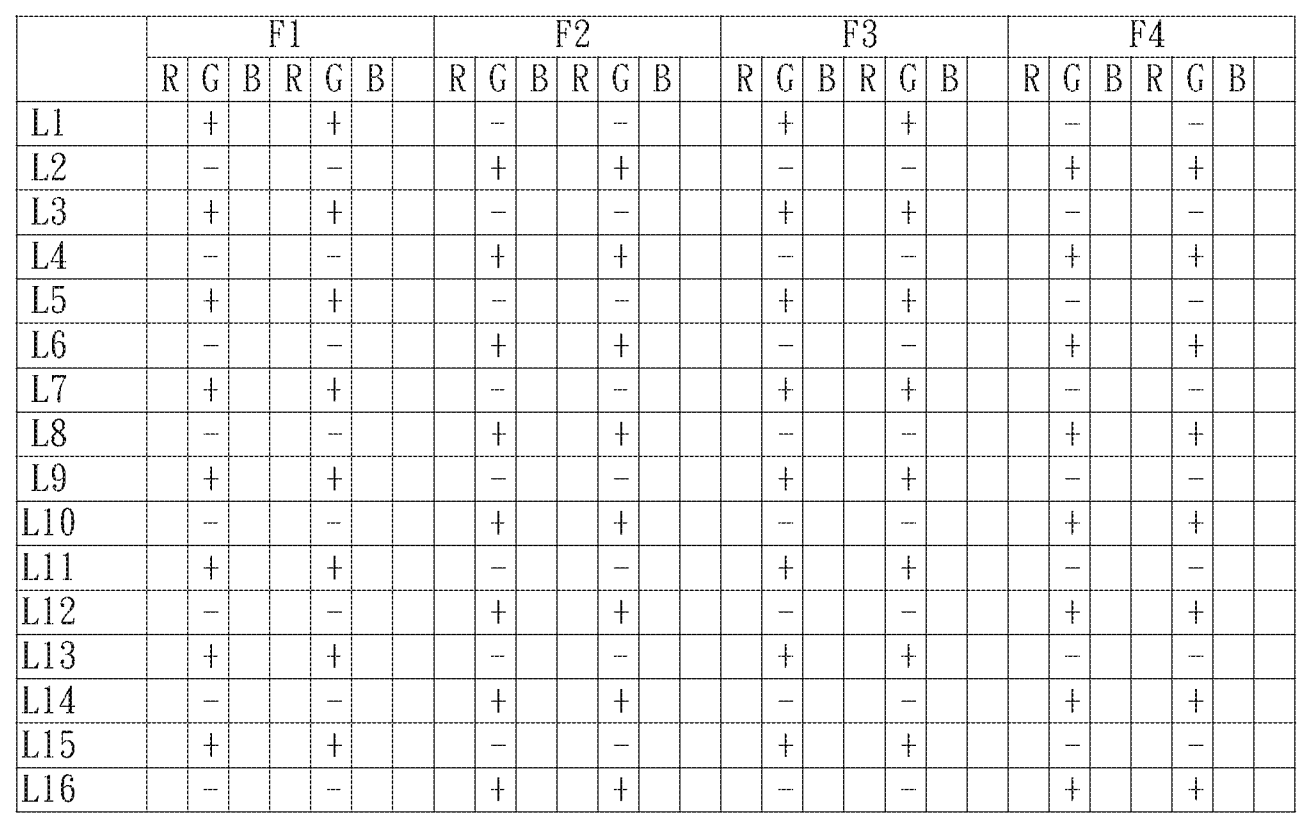

FIG. 2 illustrates a schematic diagram of using the conventional first chopper control signal CH1 having a regular arranging order to perform positive voltage offset or negative voltage offset on the pixels of different frames line by line.

FIG. 5 illustrates the random arranging order of the random chopper control signal generated by the random generator in FIG. 4.

FIG. 6 illustrates a schematic diagram of using the random chopper control signal CH having a random arranging order to perform positive voltage offset or negative voltage offset on the pixels of different frames.

DETAILED DESCRIPTION

A preferred embodiment of the invention is a random chopper control circuit. In this embodiment, the random chopper control circuit is coupled to an operational amplifier; the random chopper control circuit can be used to eliminate the offset voltage in different display panels, but not limited to this.

Figure 1:
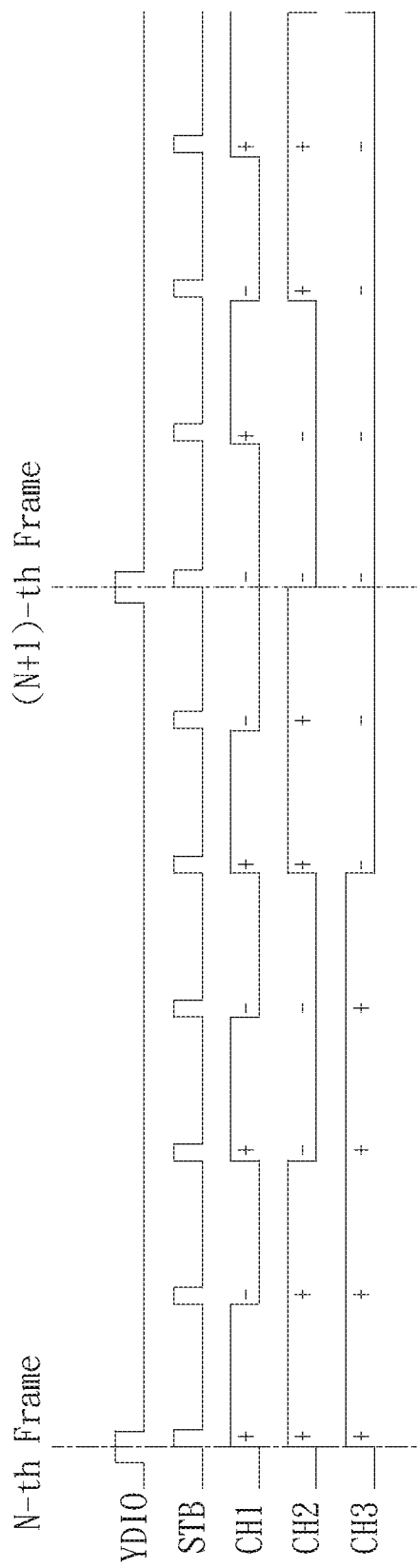
FIG. 1 illustrates timing diagrams of the conventional frame control signal YDIO, the conventional line control signal STB and the conventional first chopper control signal CH1~the third chopper control signal CH3 arranged in regular order in the prior art.
Figure 3:
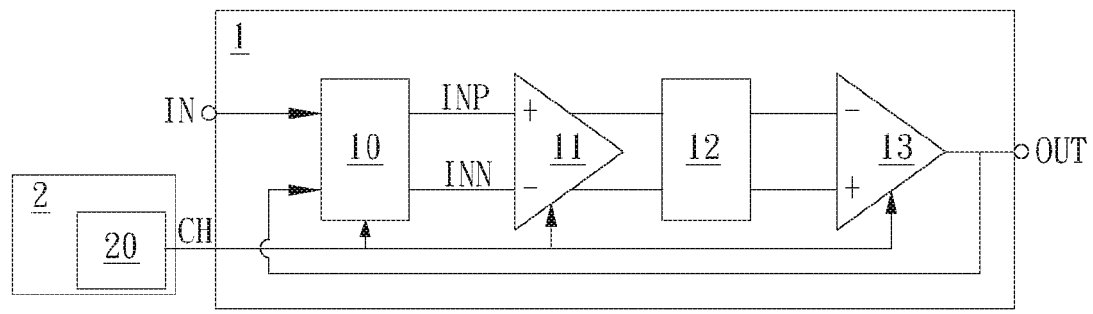
FIG. 3 illustrates a schematic diagram of the random chopper control circuit coupled to the operational amplifier in an embodiment of the invention.

Please refer to FIG. 3. FIG. 3 illustrates a schematic diagram of the random chopper control circuit coupled to the operational amplifier in this embodiment.

As shown in FIG. 3, the random chopper control circuit 2 is coupled to the operational amplifier 1. The random chopper control circuit 2 includes a random generator 20. The operational amplifier 1 includes an input terminal IN, an output terminal OUT, a first exchanging unit 10, a first stage amplifying unit 11, a second exchanging unit 12 and a second stage amplifying unit 13. Wherein, the first exchanging unit 10 is coupled to the input terminal IN and an output terminal of the second stage amplifying unit 13; the first stage amplifying unit 11 is coupled between the first exchanging unit 10 and the second exchanging unit 12; the second exchanging unit 12 is coupled between the first stage amplifying unit 11 and the second stage amplifying unit 13; the second stage amplifying unit 13 is coupled between the second exchanging unit 12 and the output terminal OUT.

The random generator 20 of the random chopper control circuit 2 is coupled to the first exchanging unit 10, the first stage amplifying unit 11 and the second stage amplifying unit 13. The random generator 20 of the random chopper control circuit 2 will generate a random chopper control signal CH having a random arranging order according to a random algorithm and output the random chopper control signal CH to the first exchanging unit 10, the first stage amplifying unit 11 and the second stage amplifying unit 13 respectively.

When the first exchanging unit 10 receives an input signal from the input terminal IN and receives a first output signal from the output terminal of the second stage amplifying unit 13, the first exchanging unit 10 will selectively exchange the input signal and the first output signal according to the random chopper control signal CH and then output the first output signal and the input signal to a positive input terminal + and a negative input terminal − of the first stage amplifying unit 11 respectively.

It should be noticed that if the first exchanging unit 10 does not exchange the input signal and the first output signal according to the random chopper control signal CH, the input signal is a positive input signal INP inputted to the positive input terminal + of the first stage amplifying unit 11 and the first output signal is a negative input signal INN inputted to the negative input terminal − of the first stage amplifying unit 11, at this time, the input signal is performed by a positive voltage offset; if the first exchanging unit 10 exchanges the input signal and the first output signal according to the random chopper control signal CH, the input signal is the negative input signal INN inputted to the negative input terminal − of the first stage amplifying unit 11 and the first output signal is the positive input signal INP inputted to the positive input terminal + of the first stage amplifying unit 11, at this time, the input signal is performed by a negative voltage offset. When the random chopper control signal CH is changed with time, the above-mentioned positive offset voltage and negative offset voltage can be canceled out by an averaging way.

When the first stage amplifying unit 11 receives the positive input signal INP and the negative input signal INN, the first stage amplifying unit 11 will amplify the positive input signal INP and the negative input signal INN according to the random chopper control signal CH and output a first amplified signal and a second amplified signal to the second exchanging unit 12 respectively. Then, the second exchanging unit 12 will selectively exchange the first amplified signal and the second amplified signal and then outputs the second amplified signal and the first amplified signal to a positive input terminal + and a negative input terminal − of the second stage amplifying unit 13 respectively. At last, when the second stage amplifying unit 13 receives the second amplified signal and the first amplified signal, the second stage amplifying unit 13 will amplify the second amplified signal and the first amplified signal according to the random chopper control signal CH and then outputs a second output signal to the output terminal OUT.

It should be noticed that the random generator 20 of the invention can generate random chopper control signals having different random arranging orders according to any random algorithms; that is to say, the random generator 20 of the invention can be a linear feedback shift register (LFSR) or any other random generators without any specific limitations. Then, a pseudo-random binary sequence (PRBS) generator used as an embodiment of the random generator 20 will be introduced as follows.

Figure 4:
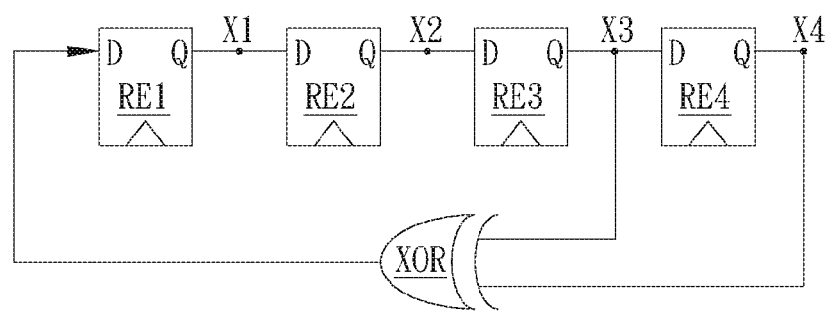
FIG. 4 illustrates an embodiment of the random generator in FIG. 3.

Please refer to FIG. 4. FIG. 4 illustrates an embodiment of the random generator 20 in FIG. 3. It can be called PRBS4 pseudo-random binary sequence generator. As shown in FIG. 4, the random generator 20 includes registers RE1~RE4 coupled in series and an exclusive-OR (XOR) gate XOR.

It should be noticed that the random generator 20 of this embodiment includes four registers, but the number of the registers is not limited to this. In addition, the type of the registers is not limited to the LFSR.

In this embodiment, an output terminal of the XOR gate XOR is coupled to an input terminal of the register RE1; two input terminals of the XOR gate XOR are coupled to a node X3 between the registers RE3 and RE4 and a node X4 at an output terminal of the register RE4 respectively. In fact, the two input terminals of the XOR gate XOR can be also coupled to a node X1 between the registers RE1 and RE2 or a node X2 between the registers RE2 and RE3, but not limited to this.

It should be noticed that the random generator 20 of the invention can couple the two input terminals of the XOR gate XOR to different nodes X1~X4 respectively to change the random arranging order of the random chopper control signal CH generated by the random generator 20. Since the random chopper control signal CH has the random arranging order instead of the regular arranging order in the prior art, the offset voltage can be smoothly eliminated both in space and in time.

Then, please refer to FIG. 5. FIG. 5 illustrates the random arranging order of the random chopper control signal CH generated by the random generator 20 in FIG. 4. As shown in FIG. 5, its longest length is 16 (namely two to the power of four), but not limited to this. Please also refer to FIG. 6. FIG. 6 illustrates a schematic diagram of using the random chopper control signal CH having a random arranging order in FIG. 5 to perform positive voltage offset or negative voltage offset on the pixels of different frames.

As shown in FIG. 6, the random chopper control signal CH performs voltage offset on the green pixel G of the first frame F1 line by line from the first line L1 to the sixteenth line L16 through its random arranging order of +, +, +, +, −, −, −, +, −, −, +, +, −, +; −, +, wherein + represents positive voltage offset and − represents negative voltage offset. Then, the random chopper control signal CH performs voltage offset on the green pixel G of the second frame F2 line by line from the first line L1 to the sixteenth line L16 through its random arranging order of −, −, −, −, +, +, +, −, +, +, −, −, +, −, +, −. As to the third frame F3 and the fourth frame F4, they can be referred to the above-mentioned first frame F1 and second frame F2.

It should be noticed that although the number of lines shown in FIG. 6 is 16 (e.g., the first line L1~the sixteenth line L16), the number of lines is not limited to this case and it can be adjusted based on the resolution of the display panel in practical applications.

Compared to the prior art, in the random chopper control circuit of the invention, the chopper control signal uses random arranging order to make changes line by line or frame by frame; therefore, it is hard to detect these changes visually and the drawback that the changes are easily detected visually due to the regular arranging order of the offset voltage in the pixels can be effectively avoided. And, the random chopper control circuit of the invention can also effectively eliminate the offset voltages in different kinds of display panel.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A random chopper control circuit coupled to an operational amplifier, the random chopper control circuit comprising:
a random generator configured to generate a random chopper control signal and output the random chopper control signal to the operational amplifier to control an operation of the operational amplifier;
wherein the operational amplifier comprises:
a first exchanging unit coupled to the random generator;
a first stage amplifying unit coupled to the first exchanging unit and the random generator;
a second exchanging unit coupled to the first stage amplifying unit; and
a second stage amplifying unit coupled to the second exchanging unit, the first exchanging unit and the random generator.

2. The random chopper control circuit of claim 1, wherein the random generator generates the random chopper control signal having a random sequence according to a random algorithm.

3. The random chopper control circuit of claim 1, wherein the first exchanging unit, the first stage amplifying unit and the second stage amplifying unit receive the random chopper control signal outputted by the random generator respectively.

4. The random chopper control circuit of claim 3, wherein when the first exchanging unit receives an input signal and receives a first output signal from an output terminal of the second stage amplifying unit, the first exchanging unit selectively exchanges the input signal and the first output signal according to the random chopper control signal and then outputs the first output signal and the input signal to a positive input terminal and a negative input terminal of the first stage amplifying unit respectively.

5. The random chopper control circuit of claim 4, wherein when the first stage amplifying unit receives the first output signal and the input signal, the first stage amplifying unit amplifies the first output signal and the input signal according to the random chopper control signal and outputs a first amplified signal and a second amplified signal to the second exchanging unit respectively.

6. The random chopper control circuit of claim 5, wherein the second exchanging unit selectively exchanges the first amplified signal and the second amplified signal and then outputs the second amplified signal and the first amplified signal to a positive input terminal and a negative input terminal of the second stage amplifying unit respectively.

7. The random chopper control circuit of claim 6, wherein when the second stage amplifying unit receives the second amplified signal and the first amplified signal, the second stage amplifying unit amplifies the second amplified signal and the first amplified signal according to the random chopper control signal and then outputs a second output signal.

* * * * *